United States Patent [19]
Jitaru

[11] Patent Number: 5,973,923
[45] Date of Patent: Oct. 26, 1999

[54] PACKAGING POWER CONVERTERS

[76] Inventor: Ionel Jitaru, 2378 N. Sun Lake Pl., Tucson, Ariz. 85749

[21] Appl. No.: 09/086,365

[22] Filed: May 28, 1998

[51] Int. Cl.⁶ .................................................. H05K 7/20
[52] U.S. Cl. ........................... 361/704; 361/705; 361/706; 361/740; 361/750; 361/752; 361/758; 257/712; 363/21; 363/144; 363/147; 165/80.2; 165/80.3; 165/185; 174/52.4; 29/602 R; 29/852
[58] Field of Search ........................... 361/683, 690–697, 361/700–721, 321.1, 818, 740; 363/147, 21; 257/685, 727, 668, 703; 165/80.3, 185, 80.1, 80.2; 365/37; 336/232, 200, 83, 198, 202, 183; 29/840, 602.1, 829, 852; 174/52.1, 252, 265; 205/125; 428/210, 131; 228/176, 123.1; 438/3, 616

[56] References Cited

U.S. PATENT DOCUMENTS

| | | | |
|---|---|---|---|
| 3,833,872 | 9/1974 | Marcus et al. | 336/232 |
| 4,547,961 | 10/1985 | Bokil et al. | 29/602 R |
| 4,873,757 | 10/1989 | Williams | 29/602.1 |
| 5,036,428 | 7/1991 | Brownhill et al. | 361/386 |
| 5,526,234 | 6/1996 | Vinciarelli et al. | 361/740 |
| 5,576,934 | 11/1996 | Roethlingshoefer et al. | 361/761 |
| 5,581,443 | 12/1996 | Nakamura et al. | 361/705 |
| 5,636,110 | 6/1997 | Lanni | 363/21 |

Primary Examiner—Leo P. Picard
Assistant Examiner—Michael Datskovsky

[57] ABSTRACT

A package for power converters in which a multilayers circuits board holds the components. The winding of the magnetic elements are incorporated in the multilayers circuit board. The top and some portion of the bottom layer are also support for electronic components. Some of the components are placed on the top layer, which may not be utilized for magnetic winding, reducing the footprint of the magnetic elements to the footprint of the magnetic core. The power dissipating devices placed on pads which have a multitude of copper coated via connecting the top to bottom layers. Through these via the heat is transferred from the power devices to the other side of the PCB. In some of the embodiment of this invention the heat can be further transferred to a metal plate connected to the multilayers circuit board via a thermally conductive insulator. The baseplate has cutouts or cavities to accommodate the magnetic cores. A thermally conductive is placed between the magnetic core and the metal plate on the bottom of the cavity.

12 Claims, 8 Drawing Sheets

PACKAGING POWER CONVERTERS

BACKGROUND OF THE INVENTION

1. Field of the Invention

The invention relates to packaging electrical components for power converters and power magnetics.

2. Description of the Prior Art

One approach to packaging electric components in power converters (FIG. 1) includes a housing which both encloses the components and means of heat extraction from the components. The house includes a non-conductive casing 5 and an aluminum heat-sinking base 6. A printed circuit board (PCB) 3 is mounted next to the upper wall 5a of the casing. Conductive pins 7 are attached directly to the PCB 3 and extend up through the wall 5a. Electronic components 9a, 9c are mounted to one or both sides of the PCB3. Larger side components such as the transformer 9c are mounted to the lower side for space reason. Power dissipating devices such as 9b are mounted directly on the base-plate 6 for better heat transfer. The power components 9b are electrically connected to the PCB by leads 12. Some of the power dissipating devices, 9d, are attached to the base plate via a thermally conductive insulator material 8. Structure 1 may be filled with an encapsulant, which acts as a heat spreader and provides mechanical support. In the case when a hard epoxy encapsullant is used a "buffer coating" material is used to protect some of the components.

BRIEF SUMMARY OF THE INVENTION

The invention provides a packaging technology for power converters and power magnetics. The packaging methodology provides a compact, inexpensive, easy to manufacture.

The invention features a package for electrical components held on a circuit board. In this packaging concept most of the power magnetic elements are constructed in to the multilayers PCB. The windings of the magnetic elements such as transformers, inductors, and in some cases even signal transformers are incorporated in the multilayers PCB. The top layer and some portion of the bottom layer are also support for electronic components. The windings of the magnetic elements are contained inside of the multilayers PCB; the electronic components are placed on the top and on the bottom of the PCB. Some of the components are located on top of the windings and the interconnections between the magnetic elements. In this way the footprint of the magnetic elements is reduced to the footprint of the transformer core. The power-dissipating devices are placed on pads, which have a multitude of copper coated via to the bottom layers. Through these via the heat is transferred from the power dissipating devices to the other side of the PCB. The heat transferred to the other side of the PCB can be further spread using a larger pad or transferred to a metallic base-plate attached to the PCB though an isolating material. For air-cooled modules the heat spreader located on the back of the power-dissipated devices through via will increase the surface contact to the airflow. In applications wherein the power dissipated by the devices cannot be easily cooled due to the limited surface of the heat spreader, an additional heat sink is attached to the heat spreader to increase its cooling area.

The unique aspect of this packaging concept is the fact that the magnetic element's windings are incorporated on the multilayers PCB construction which also serves as a support for power-dissipating components and some of the control components. The heat from the power-dissipating components is extracted through copper coated via which transfer the heat to the other side of the PCB. The heat is further transferred to a metal base-plate connected to the PCB via a thermally conductive insulator. For airflow cooling applications the heat spreader connected to the thermal via can serve as a cooling surface. A heatsink can be also attached to the heat spreader to increase the heat dissipation area.

DETAILED DESCRIPTION OF THE PREFERRED EMBODIMENTS

Figures 1, 2:
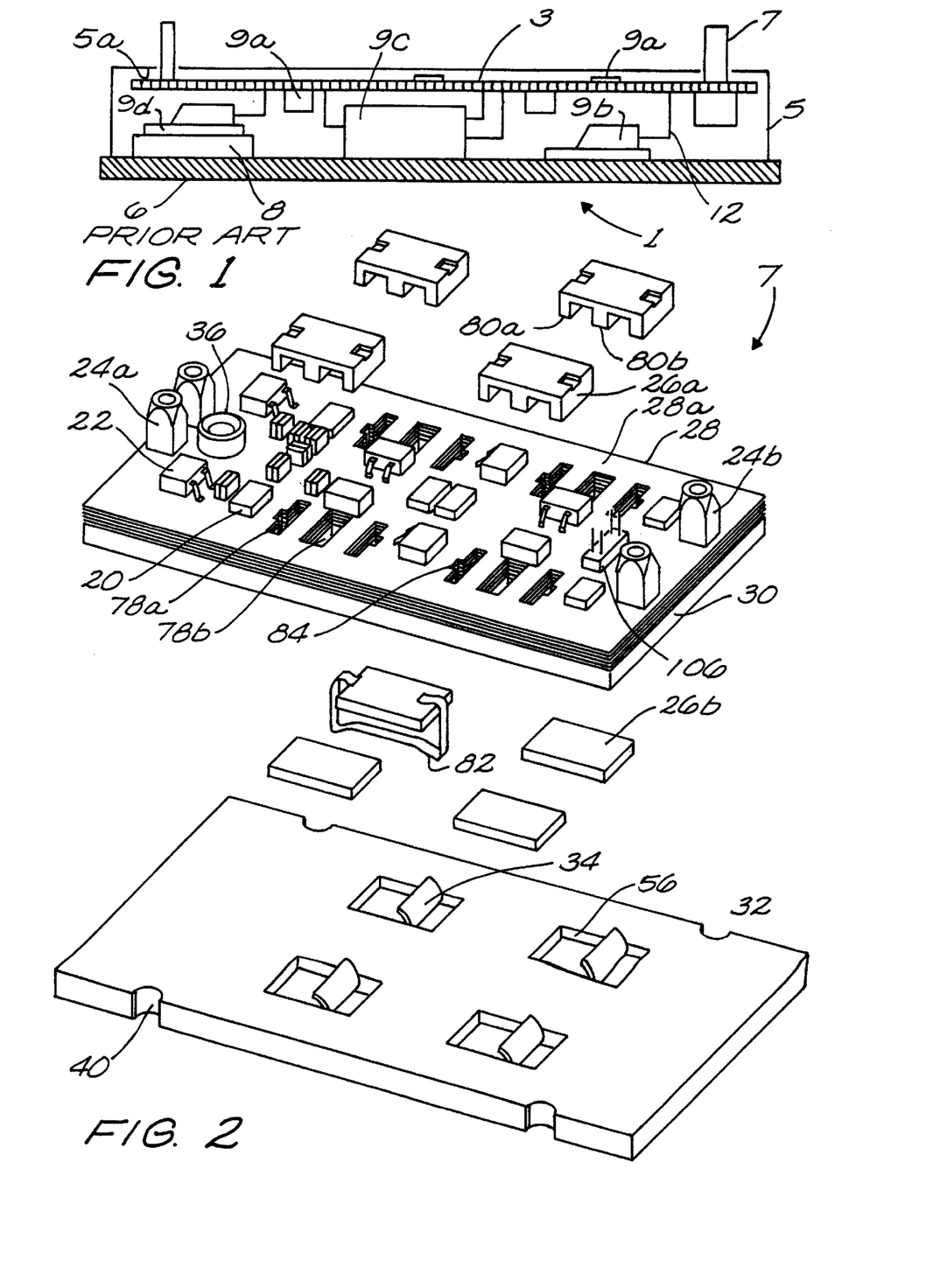
FIG. 1 is a cross-sectional side view of prior art components packaging.
FIG. 2 is a perspective exploded view of component packaging according to the invention.
Figure 4A:
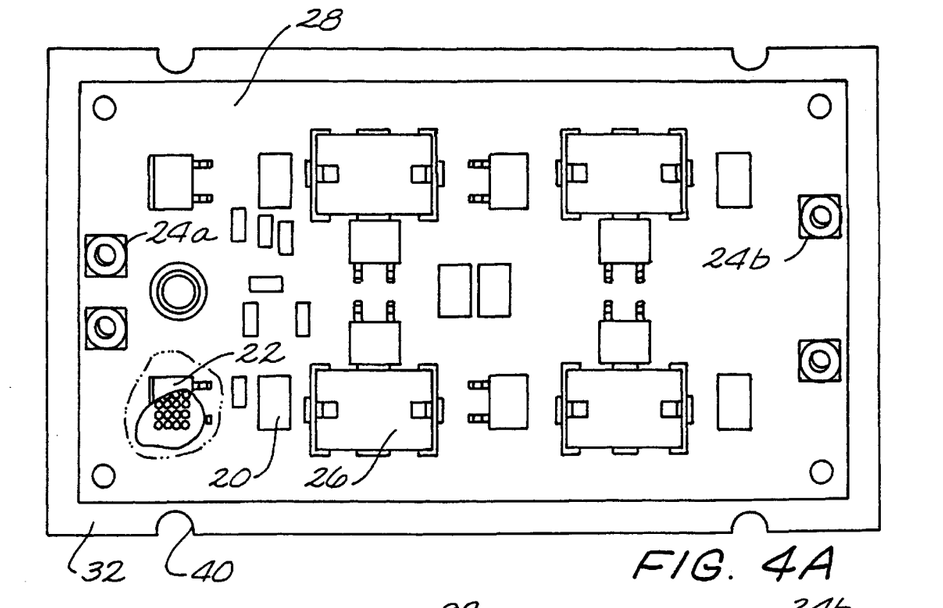
FIG. 4A is a top view of the packaging with a detailed section of the cooling via.
Figure 4B:
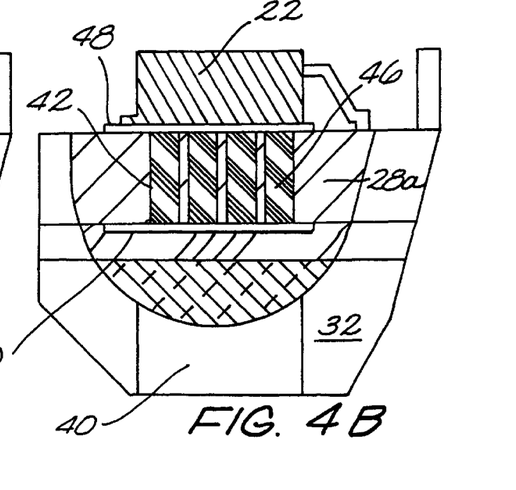
FIG. 4B is a broken view of the cooling via.

Referring to FIG. 2 in the packaging 7 provided by this invention, a power-dissipating electronic components 22 are located on the multilayers PCB 28 on top of the heat spreader pad 48, FIG. 4B. The heat spreader pad is connected to the copper coated via. A heat spreader 74, FIG. 4B, is connected on the backside of the PCB through the copper coated via 42. The copper coated via can be filled with solder or can be empty in which case the heat will be transferred thorough the metalization placed on the wall of the via. The metalization is formed by copper deposit during the plating process associated with the manufacturing process of the PCB. As a result of the plating process the wall of the via is covered with copper. The via can be also filled with a thermally conductive material 30a as is presented in FIG. 4D. The isolated material 30 placed under the PCB 28 under pressure will penetrate through the via filling the space. In between the PCB 28 and the metal base plate 32 an insulator material with good thermal conductivity characteristics 30 is placed. In this way the heat from the power dissipating components 22, is transferred through the copper pad 48 on which the power dissipating device is mounted, to the copper coated via 42 to the other side of the PCB, 28B, to the heat spreader 74. The heat is further transferred through the thermally conductive insulator material 30 to the metal plate 32. In the case wherein the insulator material 30 will penetrate through the copper coated via 42 the surface contact will increase and as a result the thermal transfer from the copper pad 48 to the metal plate 30 will be improved.

Figure 3A:
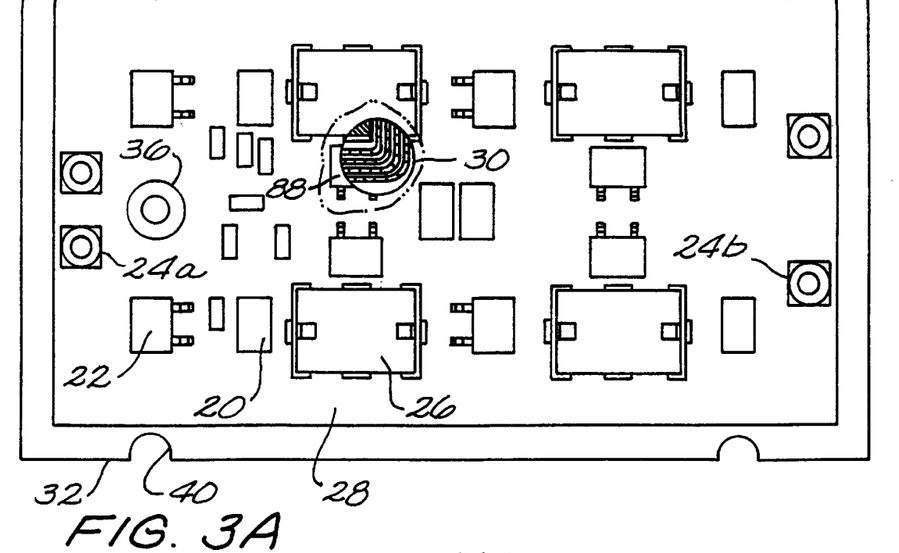
FIG. 3A is a top view of the packaging with a detailed section of the magnetic' winding.
Figure 3B:
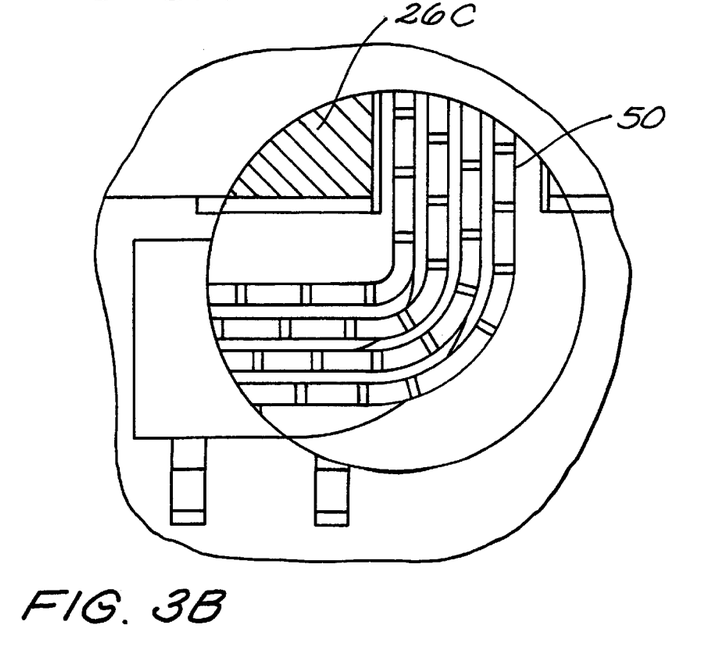
FIG. 3B is an enlarged view of a section of FIG. 3A.

The main embodiments of this invention is the magnetic elements implementation in the multilayers PCB and the means in which the heat is extracted form the power dissipating devices, from the magnetic winding 50, (FIG. 3A and FIG. 3B), from the magnetic core 26A and 26B, and the low power dissipation devices 20 to the baseplate 32. To increase the power density, some components 88 are mounted on top of the multilayers PCB 28a, on top of the windings 50 embedded in the inner layers of the multilayers PCB 28. In this way the footprint of the magnetic element is reduced to the footprint of the magnetic core 26a.

The main embodiment of this invention is the fact that the magnetics elements are implemented in the multilayers PCB 28. In the prior art the magnetic elements were discrete devices which were connected to the PCB by means of through hole or surface mounted pins. The presence of the connecting pins increases the cost of the magnetic element and it reduces the reliability of the magnetic device due to the mechanical failure of the pins. The interconnection pin can be bent or broken easily. The presence of the interconnection pins adds supplementary stray inductance in series with the transformer. This will negatively impact the electrical performance of the circuit. In most of the applications the energy contained in this parasitic inductance is dissipated, reducing the efficiency with which the power is processed by the converter. In addition to that the energy contained in the parasitic inductance of the interconnection pins can increase to voltage or current stress on the electrical components.

In this invention the magnetic elements have the windings embedded inside of the multilayers PCB. The interconnection between the magnetic elements and between the magnetic elements and the electronic components are made through copper pads etched in the layers of the multilayers PCB and through the copper coated via 42 in the multiyear PCB 28. This allows the use of more complex winding arrangements and allows the use of more magnetic elements on the same multilayers PCB construction.

In the prior art, for higher power magnetics a larger magnetic core is required. The larger magnetic core will increase the maximum height of the power converter. In this invention instead of using a very large magnetic element, smaller transformers with lower profile cores are utilized on the same multilayers PCB construction. The interconnections of these magnetic elements are made within the multilayers PCB. The converter will contain a number of smaller magnetic elements achieving a low profile package. The magnetic cores 26A and 26b will penetrate through multilayers PCB via the cutouts 78a and 78b fitted for the outer legs 80a and inner legs 80b. The magnetic sections 26a and 26b can be glued together or attached via a spring clips 82. To accommodate the spring clip additional cutouts in the PCB 84 are produced. The bottom side of the magnetic core 26b, will surface on the back of the PCB. To be able to accommodate the magnetic cores 26b cutouts 86 are made through the insulator material 30. In most of the applications the thickness of the insulator material is smaller than the height of the magnetic core. To accommodate the magnetic core 26b, cavities 56, are produced into the base plate 32. Due to the fragile characteristic of the magnetic cores, a soft pad 56, with small thermal impedance is placed under the magnetic core 26b in the cavity. The pad 56, will dampen the vibration of the magnetic core. The low thermal impedance of the pad 56, will also offer a cooling path for the magnetic core. In some applications wherein insulation has to be achieved to the base plate, the pad, 56 have to have insulation properties.

The entire structure 7 is press together in a way that the magnetic core 26b will be placed on top of the pad 56. The thickness of the pad has to chosen in a way that the metallic plate 32 makes good contact with the insulator 30. The insulator 30, is pressed between the PCB 28 and metal plate 32. The permanent attachment can be done in several ways. In the preferred embodiment the isolator material 30 has adhesive properties stimulated by a curing process at higher temperature. After the curing process the insulator created a bound between the PCB 28, and the metal plate 32. In applications wherein the structure 28 is connected to another plate, the flanges 40 can accommodate screws.

Figure 4C:
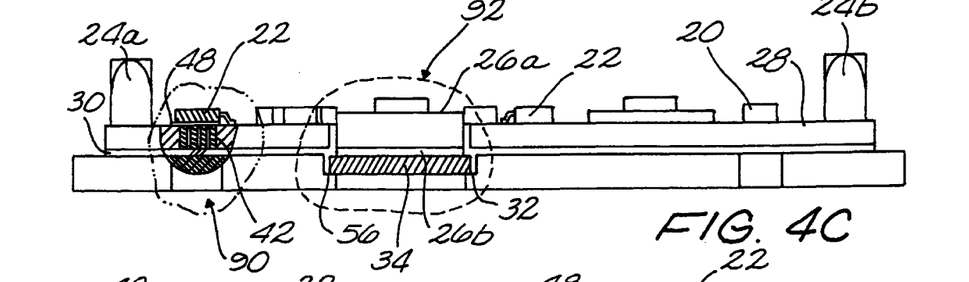
FIG. 4C is a section of the packaging through the cooling via and through a magnetic element.
Figure 4D:
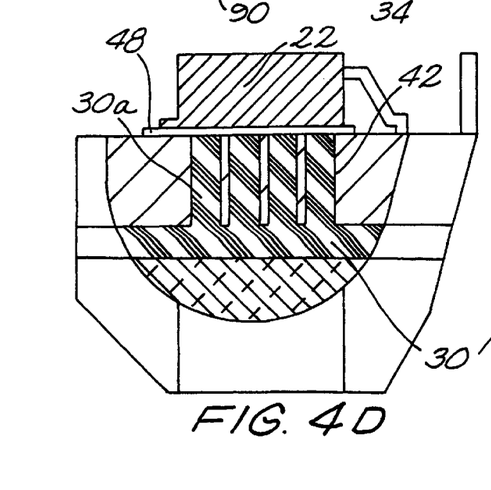
FIG. 4D is a broken view of the cooling via wherein the insulator material penetrates in the cooling via.

A cross-section of the structure 7, mounted is presented in FIG. 4C. A section of the structure is blown in FIG. 4B. In the cross-section 90 is presented the location of a power dissipation device on top of the copper pad 48, and the copper coated via 42. This copper coated via carry the heat to the heat spreader 74. The heat is further transferred via the thermally conductive insulator 30 to the metal plate 32.

A second cross-section of the mounted structure 7, is presented in FIG. 4C. In the cross-section, 92, is presented the upper section of the magnetic core 26a, the bottom section of the magnetic core 26b, the pad under the magnetic core 34 located in the cavity 56. The heat generated in the magnetic core 26 is transferred to the base plate through the pad 34. For components which have to have a temperature close to the temperature of the base plate, copper coated via are placed under the components or to the traces and pad connected to the components. In this way low thermal impedance is achieved to the base plate. With low thermal impedance to the base plate, the temperature rise of these components will be small.

Using screws, clips, or different means of applying pressure to the structure 7 can also make the attachment of the PCB 28, to the isolator 30 and the base-plate 32. In some applications the cutouts in the metallic plate 32 can penetrate through the plate. The magnetic cores 26b will be visible from the bottom side of the metallic plate. For protecting the magnetic cores 26b, soft epoxy material can cover the remaining cavity in between the magnetic core and the surface of the base plate 32. In some application that cavity can be left open.

Figure 8:
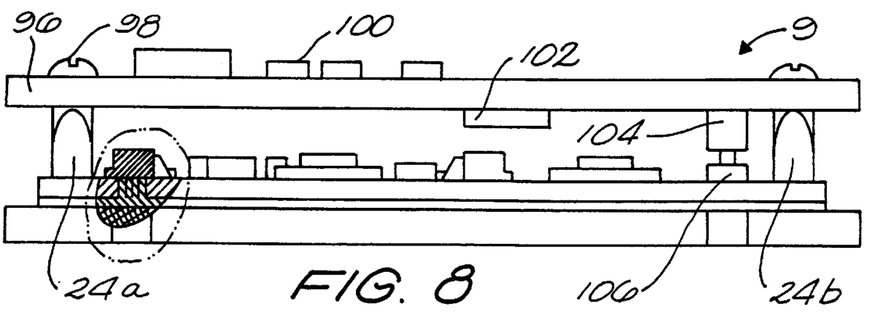
FIG. 8 is a cross-section of the packaging connected to the motherboard.

In FIG. 8 is presented a structure 9 wherein the package 7 is attached to a motherboard 96. The attachment is done through the power connectors 24a and 24b. The power connectors are attached to the motherboard 96 through screws 98. There is a signal connector 106 located on the structure 7. The signal connector 106 is connected to the matching signal connector 104 located on motherboard 96. More than one structure 7 can be connected to the same motherboard 96. On the motherboard 96 there are additional components 100 and 102. This structure it is suitable for systems wherein only the power train and some control functions are located on the structure 7. Some of the control section components, supplementary logic circuits and EMI filters are located on the motherboard. The bottom layer of the motherboard 96 may contain copper shields to protect the noise sensitive components. The noise sensitive components are located on the motherboard and the power dissipate components, some control components and the magnetics are located on the structure 7.

Figure 5A:
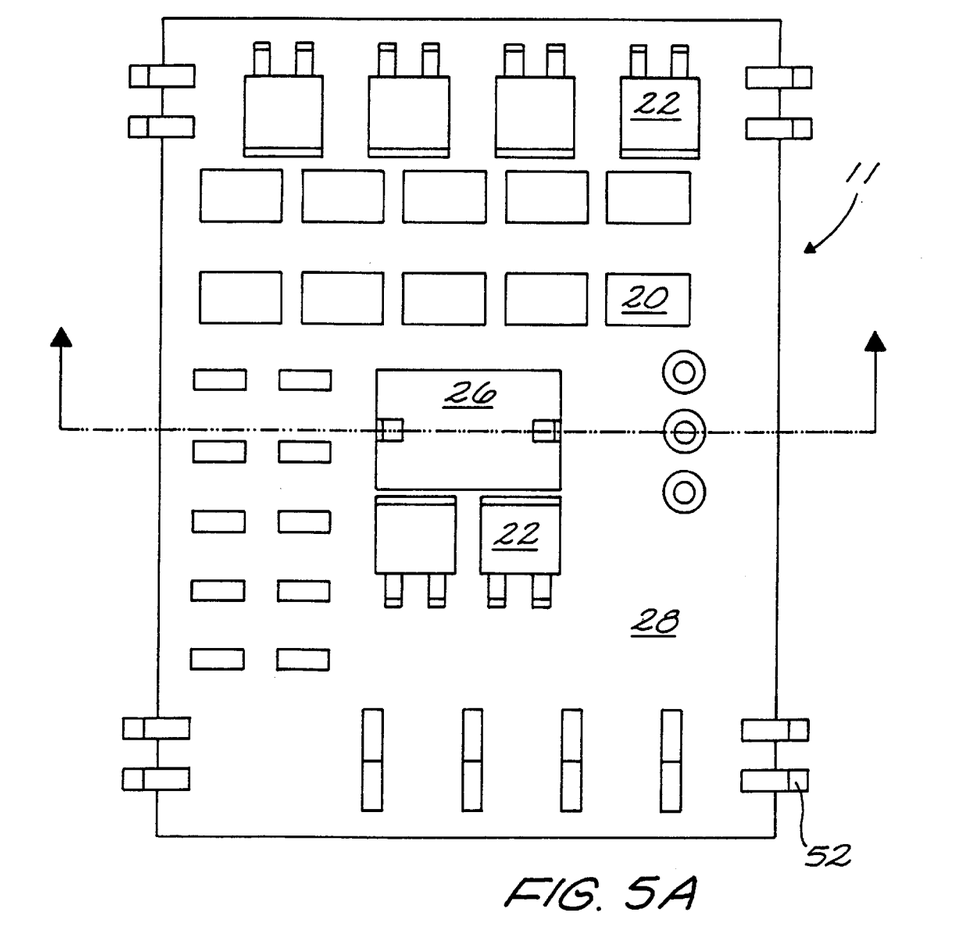
FIG. 5A is the top view of the horizontal packaging with airflow cooling.
Figure 5B:
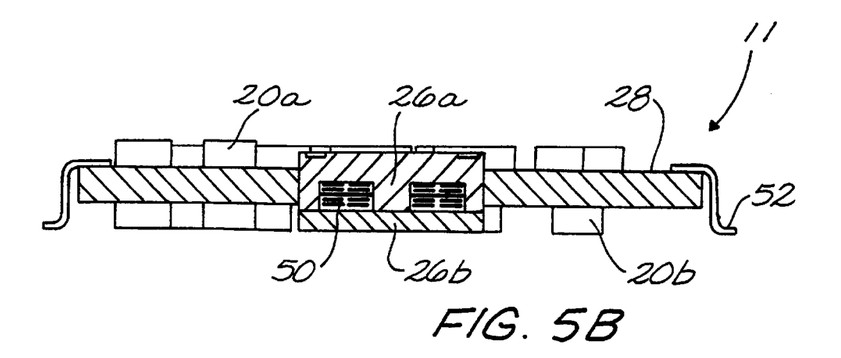
FIG. 5B it is a cross-section of the horizontal packaging with the airflow cooling.

In FIGS. 5a and 5b is presented a packaging structure 11. In this structure the magnetic element has its winding embedded within the multilayers PCB 28 as it is in structure 7. The components are located on both sides of the multilayers PCB. This packaging structure applies to low power dissipation application wherein there is an airflow. The entire surface of the multilayers PCB 28 becomes a heatsink. The structure 11 is connected to the other circuitry via the pins 52.

Figure 7A:
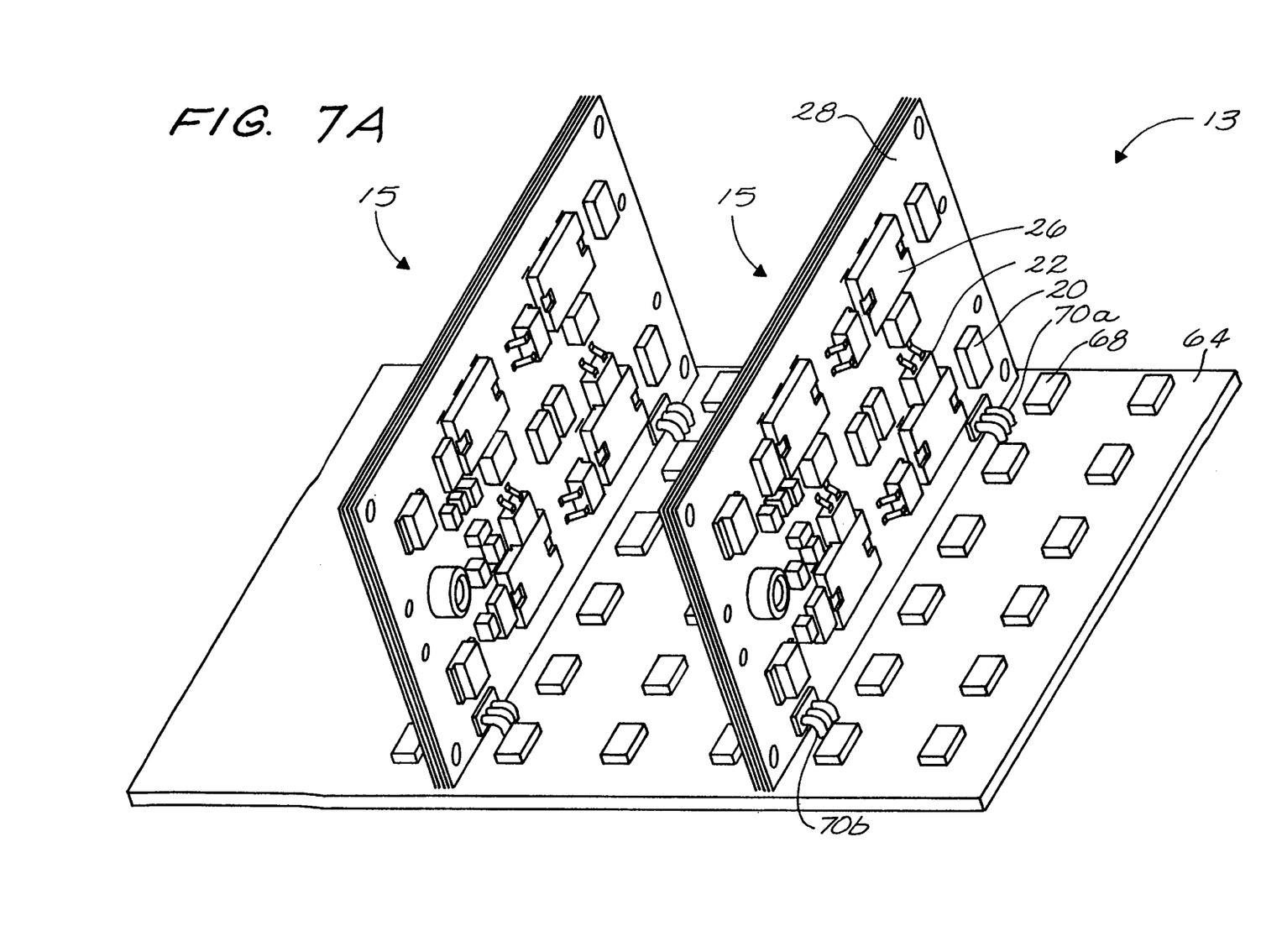
FIG. 7A it is a perspective view of the power packages for airflow cooling.

In FIG. 7A is depicted a power system which contains several packaging structures 15. The structure 15 include the magnetic elements 26, the power dissipating components 22, the low power dissipation components 20, similar with structure 7. The main difference is that there is not an isolator 30, and a base plate 32. The cooling is accomplished by the air, which flows in between the packaging structures 15. The entire surface of 15 becomes a heatsink. The structures 15 are connected to the motherboard 64 through signal connectors 70a, and power connectors 70b.

Supplementary components are located on the motherboard 64.

Figure 7B:
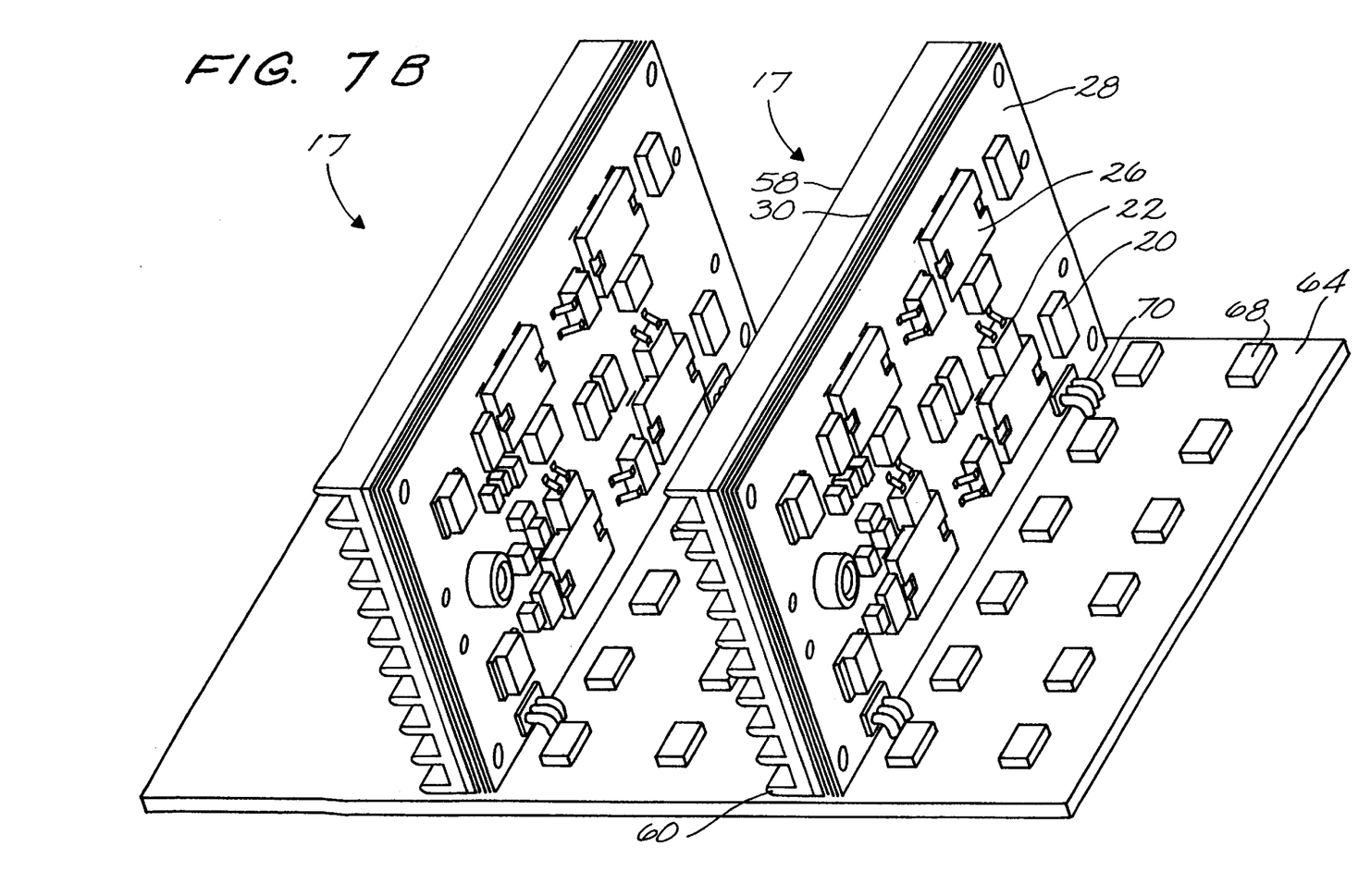
FIG. 7B is a perspective view of the power packages for airflow cooling and additional heating applied to the multilayers circuit board.

In FIG. 7B the motherboard 64 is connected to two packaging structures 17. These packaging structures contain the same components as structure 15 with an additional heat sink 58 attached to the multilayers PCB 28 through the insulator 30.

Figure 6:
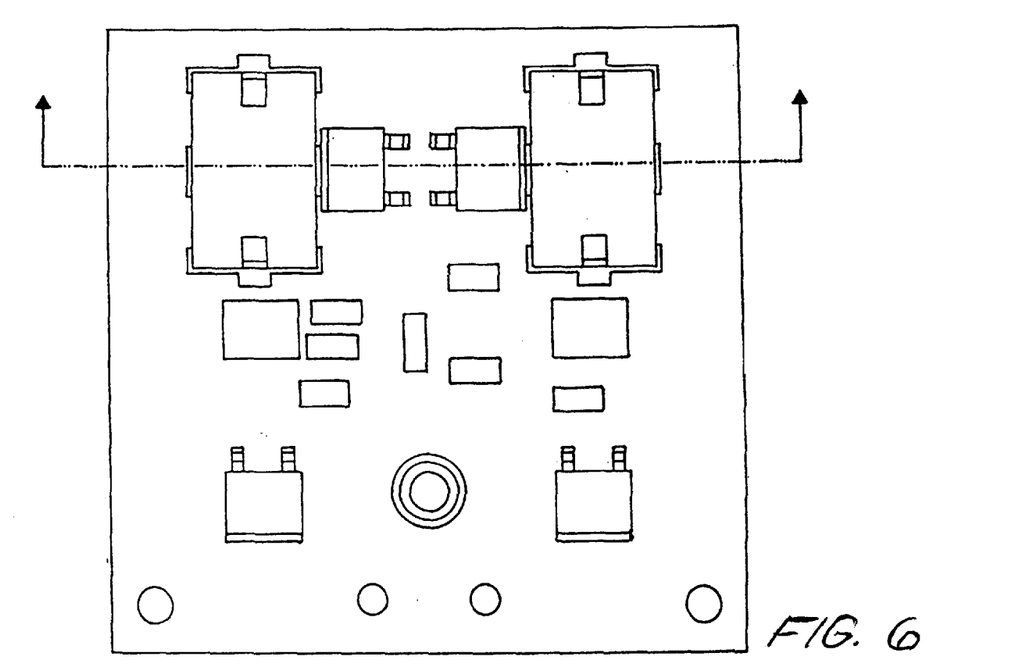
FIG. 6 is a top view of the packaging.
Figure 6A:
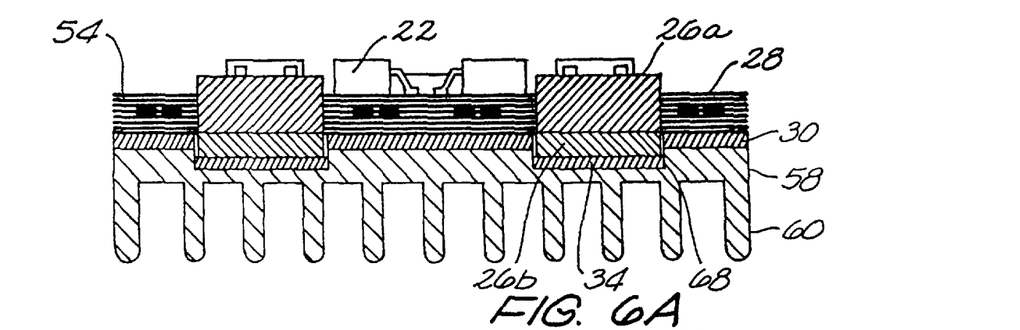
FIG. 6A is a cross-section of the package with cooling by airflow and cavities for magnetic cores.
Figure 6B:
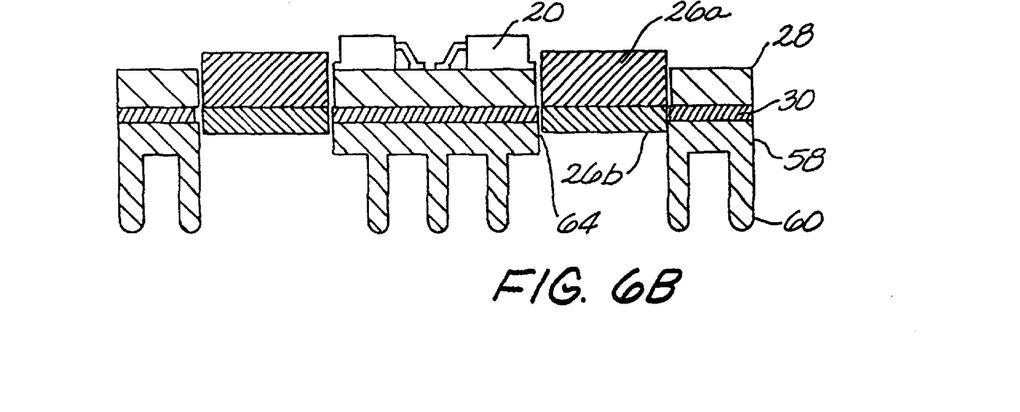
FIG. 6B is a cross-section of the package with cooling by airflow and holes for magnetic cores.

Two types of heatsink construction are presented in FIG. 6A and 6B. In FIG. 6A the heatsink 58 has air fins 60 and cavities 62. In the cavities a soft compressible material 34, with low thermal impedance is placed. The insulator with low thermal impedance 30 is placed between the multilayers PCB 28 and the base plate 58. The magnetic core 26b is cooled via the soft pad 34. The power-dissipation devices are cooled though copper coated via like in structure 7.

In FIG. 6B the heatsink 58 with air fins 60 has cutout-outs 64 to accommodate for the magnetic core 26b. The cooling of the magnetic cores 26a and 26b is accomplished by the airflow. The cooling of the power-dissipation devices is done through copper coated via 42.

Figure 9:
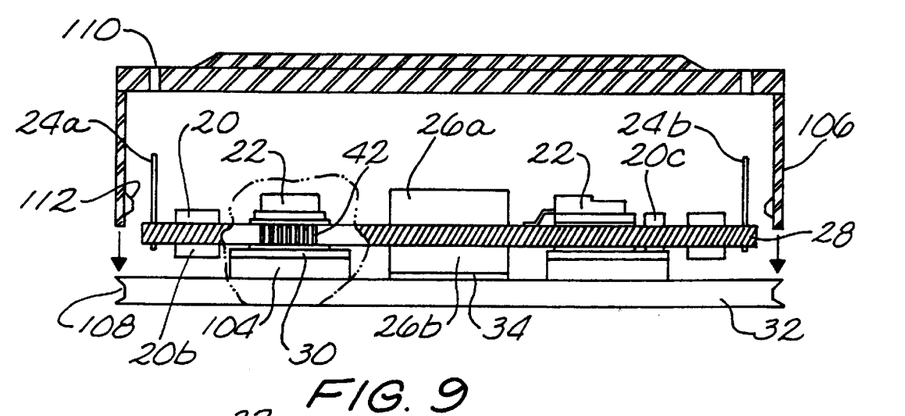
FIG. 9 it is another embodiment of the present invention.

In FIG. 9 is presented a packaging structure wherein the metal plate 32 does not contain cavities. It has elevated sections 104, which makes contact with the thermally conductive insulator 30, which is placed under the multilayers PCB 28. The elevated sections of the metal plate 104 are primarily placed under the power dissipated devices 22 and other low dissipation components 20c which require to have a temperature close to the base plate temperature. The thermally conductive soft pad 34, on the base plate 32 supports the magnetic cores 26a and 26b. The height of the elevated section of the baseplate 104, are function of the height of the magnetic core 26b and the compression ratio of the pad 34. The advantage of this packaging concept is the fact that more components can be mounted on the multilayers PCB on the backside 20b. This package is suitable for power converters, which contains all the control and signal interface functions. The interconnection pins 24a and 24b will provide the power and signal connections to the outside word. The cover 106 contains holes 110 to accommodate the interconnection pins 24a and 24b.

For the purpose of attaching case 106 to the baseplate 32 (FIG. 9) teeth 112 are formed along the lower edge of the case. A matching grove 108 is undercut into the base plate 32.

Figure 10A:
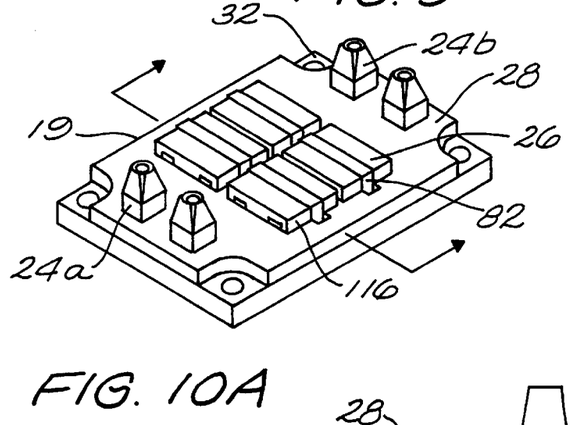
FIG. 10A is a high power magnetics package according to this invention
Figure 10B:
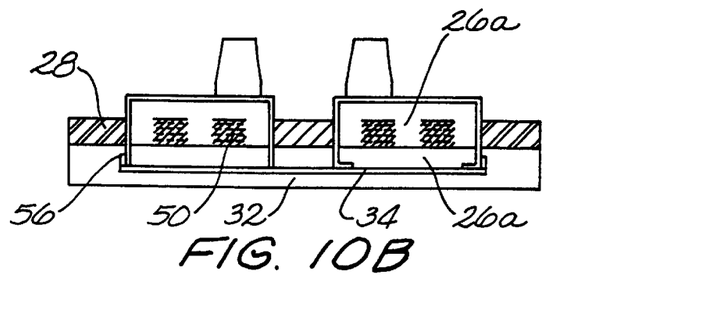
FIG. 10B is a cross-section of the magnetic package presented in FIG. 10.

In FIG. 10A is presented a high power magnetic structure wherein the magnetic core is formed by several small magnetic cores 26. A cross-section through the structure 19 is presented in FIG. 10B. The windings 50 of the magnetic structure are embedded in the multilayer PCB layers. The cutouts 116 in the multilayers PCB 28 are made to accommodate the magnetic cores 26. Power connectors are inserted in the multilayers PCB 28. The connectors 24a and 24b are connected to the windings 50. The cores 26a and 26b are attached together via the clips 82. The multilayers PCB 28 wherein the windings 50 are embedded into also offers support for the magnetic cores 26. A cavity 56 is placed in the base plate 32. A thermally conductive soft pad is placed under the magnetic core 26b on top of base plate 32.

What is claimed:

1. A package for electrical components, comprising: a multilayer circuit board having a top side and a bottom side and inner layers; windings of a magnetic element embedded in said multilayer circuit board; a magnetic core penetrating through said multilayer circuit board through said windings; power dissipating components placed on a first thermally conductive pad secured to the top side of said multilayer circuit board and connected to copper coated via which penetrate said multilayer circuit board to an opposing side of said multilayer circuit board to a second thermally conductive pad, a metal plate, an elevated section of metal plate attached to the bottom side of said multilayer circuit board through a thermally conductive insulated material, said elevated section of metal plate placed under said first thermally coductive pad, and thermally conductive compressible pad positioned between said magnetic core and said elevated section of metal plate.

2. The package of claim 1 wherein the said bottom side of said multilayers circuit board is attached to a metal plate through a thermally conductive insolated material, said metal plate having cutouts to accommodate said magnetic core which will penetrate through said cutouts and cutouts to accommodate the said electronic components placed on said bottom of the multilayers circuit board.

3. The package of claim 1 wherein the said bottom side of said multilayers circuit board is attached to a metal plate through a thermally conductive insolated material, said metal plate having cavities to accommodate said magnetic core which will penetrate into said cavities, a thermally conductive compressible pad in between said magnetic cores and the bottom of said cavities and cavities to accommodate the said electronic components placed on said bottom of the multilayers circuit board.

4. The package of claim 2, wherein the said metal plate has fins to increase the cooling surface.

5. The package of claim 3, wherein the said metal plate has fins to increase the cooling surface.

6. The package of claim 1, wherein the said metal plate has fins to increase the cooling surface.

7. The package of claim 1 mounted vertically on another circuit board and placed to sufficient distance to other packages of claim 1, paralleled to each other, to allow the air flow parallel with the surface of package of claim 1 to cool the surface of said multilayers circuit board.

8. The package of claim 4 mounted vertically on another circuit board and placed to sufficient distance to others packages of claim 1, parallel to each other, to allow the air flow parallel with the surface of package of claim 1 to cool the surface of said multilayers circuit board and said metal plate.

9. The package of claim 5 mounted vertically on another circuit board and placed to sufficient distance to others packages of claim 1, parallel to each other, to allow the air flow parallel with the surface of package of claim 1 to cool the surface of said multilayers circuit board and said metal plate.

10. The package of claim 6 mounted vertically on another circuit board and placed to sufficient distance to others packages of claim 1, parallel to each other, to allow the air flow parallel with the surface of package of claim 1 to cool the surface of said multilayers circuit board and said metal plate.

11. The package of claim 1 wherein the said winding of said magnetic elements are contained within the inner layers of said multilayers circuit board, some of the electrical components being placed on top layer located on top of said windings.

12. The package of claim 1, further including: devices placed on said top side and thermally communicating with said second thermally conductive pad using a second copper coated via.

* * * * *